(12) United States Patent
Ip et al.

(10) Patent No.: US 7,421,668 B1
(45) Date of Patent: Sep. 2, 2008

(54) MEANINGFUL VISUALIZATION OF PROPERTIES INDEPENDENT OF A CIRCUIT DESIGN

(75) Inventors: Chung-Wah N. Ip, Fremont, CA (US); Yann Antonioli, Mountain View, CA (US)

(73) Assignee: Jasper Design Automation, Inc., Mountain View, CA (US)

( * ) Notice: Subject to any disclaimer, the term of this patent is extended or adjusted under 35 U.S.C. 154(b) by 182 days.

(21) Appl. No.: 11/007,860

(22) Filed: Dec. 8, 2004

(51) Int. Cl.
*G06F 17/50* (2006.01)
(52) U.S. Cl. .............................. 716/5; 716/4
(58) Field of Classification Search ................ 716/4–6, 716/18; 703/14–15
See application file for complete search history.

(56) References Cited

U.S. PATENT DOCUMENTS

| | | | | |
|---|---|---|---|---|
| 6,484,134 | B1 * | 11/2002 | Hoskote | 703/14 |
| 6,751,582 | B1 | 6/2004 | Andersen et al. | |
| 6,985,840 | B1 * | 1/2006 | Hsu et al. | 703/7 |
| 2003/0208730 | A1 * | 11/2003 | Singhal et al. | 716/4 |
| 2005/0268265 | A1 * | 12/2005 | Ly et al. | 716/6 |
| 2006/0036983 | A1 * | 2/2006 | Iwashita | 716/5 |
| 2006/0085774 | A1 * | 4/2006 | Moorby | 716/5 |

OTHER PUBLICATIONS

Ben-David, S., Gringauze, A., Sterin, B., Wolfsthal, Y., "PathFinder: A Tool For Design Exploration", Computer-Aided Verification Conference, 2002.
Clarke, E., Byre, A., Armani, R., Zhu, Y., "Bounded Model Checking Using Satisfiability Solving", Formal Methods In System Design, 2001.
McMillan, K.L., "Symbolic Model Checking" Kluwer Academic Publishers, 1993 pp. 11-212.

* cited by examiner

*Primary Examiner*—Paul Dinh
(74) *Attorney, Agent, or Firm*—Fenwick & West, LLP

(57) ABSTRACT

A property used in functional verification of a circuit design is debugged independently of the circuit design for which the property is intended. Visualization of the property under various conditions helps a user to debug any errors in how the property is implemented in a requirements model. To visualize a particular property, a trace of a corresponding property in the requirements model is generated. The trace illustrates waveforms of a set of signals related to the property for a number of clock cycles. To visualize the property under various conditions, a user can find additional traces of the property by applying visualization constraints to obtain meaningful traces.

55 Claims, 8 Drawing Sheets

MEANINGFUL VISUALIZATION OF PROPERTIES INDEPENDENT OF A CIRCUIT DESIGN

BACKGROUND

1. Field of the Invention

This invention relates generally to the field of verification of circuit designs, and in particular to the visualization of properties used in the verification of a circuit design.

2. Background of the Invention

Over the last 30 years, the complexity of integrated circuits has increased greatly. This increase in complexity has exacerbated the difficulty of verifying circuit designs. In a typical integrated circuit design process, which includes many steps, the verification step consumes approximately 70-80% of the total time and resources. Aspects of the circuit design such as time-to-market and profit margin greatly depend on the verification step. As a result, flaws in the design that are not found during the verification step can have significant economic impact by increasing time-to-market and reducing profit margins. To maximize profit, therefore, the techniques used for verification should be as efficient as possible.

As the complexity in circuit design has increased, there has been a corresponding improvement in various kinds of verification and debugging techniques. In fact, these verification and debugging techniques have evolved from relatively simple transistor circuit-level simulation (in the early 1970s) to logic gate-level simulation (in the late 1980s) to the current art that uses Register Transfer Language (RTL)-level simulation. RTL describes the registers of a computer or digital electronic system and the way in which data are transferred among them.

Existing verification and debugging tools are used in the design flow of a circuit. The design flow begins with the creation of a circuit design at the RTL level using RTL source code. The RTL source code is specified according to a Hardware Description Language (HDL), such as Verilog HDL or VHDL. Circuit designers use high-level hardware description languages because of the size and complexity of modern integrated circuits. Circuit designs are developed in a high-level language using computer-implemented software applications, which enable a user to use text-editing and graphical tools to create a HDL-based design.

In the design flow, creation of the RTL source code is followed by verification of the design to check if the RTL source code meets various design specifications. This verification is sometimes performed by simulation of the RTL code using a "test bench," which includes stimulus generators and simulation monitors. The verification method involving the use of RTL source code and test bench is referred to as the simulation process. For a circuit having n inputs, there would be $2^n$ possible combinations of inputs at any given time. Where n is large, such as for a complex design, the number of possible input sequences becomes prohibitively large for verification. To simplify the verification process, therefore, only a subset of all possible inputs is described in a particular test bench. Thus, the circuit behavior for all possible combinations of inputs is not checked.

An increasingly popular alternative to simulation is to use formal methods to verify the properties of a design completely. Formal methods use mathematical techniques to prove that a property is either always true or to provide an example condition (called a counterexample) that demonstrates the property is false. Tools that use formal methods to verify RTL source code and design properties are known as "model checkers." Design properties to be verified include behavior that must be satisfied by the circuit design. Since properties define the design requirements in pure mathematical terms, this enables analysis of all possible valid inputs for a given circuit and is akin to an exhaustive simulation. Formal verification methods are therefore more exhaustive when compared to simulation methods. Moreover, formal verification methods provide many advantages over the simulation methods, such as reduced validation time, quicker time-to-market, reduced costs, and high reliability.

For simulation as well as for formal verification tools, the use of environment and design properties as verification components are becoming more popular recently, typically known as the assertion-based verification (ABV) methodology. Typically ABV requires the user to create a set of properties that can be expressed as temporal sequences of events, accessing primarily the inputs and the internal signals within the design. During the verification process, specific directives, such as "assume," "assert," and "cover" are provided for each of these properties. A property that is to be proved or checked is an assertion. A property that is used to constrain the legal values at the inputs of the design during verification is an assumption. To cover a property means using the property as a metric to determine how much of the design has been exercised. Examples of languages for specifying these kinds of verification components include but are not limited to Open Verification Library (OVL), System Verilog Assertion (SVA), and Property Specification Language (PSL).

As users create more complex verification components, this process becomes more onerous. In additional to properties in the form of simple temporal sequences of events, high-level requirements describing the end-to-end behavior of a circuit design in terms of the circuit's input and output signals (e.g., viewing the circuit design from a "black-box" perspective) are also becoming popular. High-level requirements need not be limited to input and output signals, however, and they may also include requirements that describe internal architecture of the design, such as the state of a data path within the design or other internal signals.

The high-level requirements are typically encoded in the requirements model. FIG. 1 illustrates block diagram of a requirements model 120 and a circuit design 130, which are debugged concurrently in accordance with existing verification techniques. The requirements model 120 and the circuit design 130 are coupled so that input signals for the circuit design 130 are also coupled as inputs to the requirements model 120 and the output signals of the circuit design 130 are coupled as inputs to the requirements model 120. In this specific example of a requirement model, the outputs of the requirements model 120, property_0 through property_k, indicate whether particular properties of the set of high-level requirements have been violated.

Regardless of whether simulation or formal verification is used, ensuring the correctness of environment and design properties—whether in the form of assertions, high-level requirements, or other forms—is important for proper verification of a circuit design. Otherwise, errors detected during the verification process may reflect errors in the properties rather than a true error in the circuit design that is being verified.

With traditional simulation and formal verification tools, the related verification components, such as test benches, assertions, or high-level requirements, are debugged at the same time as the design. In one example, a user creates a simulation test bench and then runs a simulation on the design. If the simulation fails, the user checks the test bench and the design. Any problems in the test bench, if responsible for the failure, are fixed to make the simulation pass. In another example, a user writes an assertion and uses a formal verification tool. If the formal verification of the assertion fails, the user checks the assertion and the design. Any problems in the assertion, if responsible for the failure, are fixed to continue the verification process.

When high-level requirements and their requirement model are debugged along with the circuit design during the formal verification process, the complexity of the debugging effort is further increased. In the extreme, these requirements may be a self-contained, high-level model that can be simulated, such as a process model implementing an instruction set architecture or a SystemC transaction-based model of the design. While in some cases the requirements can be simulated with simulation vectors to determine their correctness, it is generally difficult to create simulation vectors to simulate assertions or requirements that do not represent a self-contained, high-level model of the design.

Such a concurrent verification scheme of debugging the design and the verification components at the same time leads to inefficiencies in the debugging and verification processes. In the example explained above, a detected violation of a design may be due either to a bug in the circuit design 130 or in the way in which the requirement model 120 is expressed. Accordingly, it is desirable to improve upon existing verification methodologies to avoid such inefficiencies and uncertain results.

SUMMARY OF THE INVENTION

To avoid many of the problems of existing simulation and formal verification methodologies, embodiments of the invention enables a user to visualize, and therefore debug, a set of properties independently of any circuit designs for which the properties are intended. A wide range of properties can be visualized using the invention, including simple Boolean properties, simple temporal properties, and high-level properties.

In one embodiment, visualization of a property is performed through trace generations under various temporary visualization constraints. By viewing a waveform representation or a trace of the values from a number of signals related to the specific property, a user can visualize how accurately the code reflects the actual intent of the property. One or more "meaningful" traces of the property can be obtained for visualizing different aspects of the property. A trace may show that the property is correctly modeled and illustrates the intended behavior, or it may show that the property is incorrectly modeled because it illustrates an unwanted behavior. In this way, a user can analyze the property to ascertain their correctness and appropriateness before applying them to an actual circuit design.

In another embodiment of the invention, various tools are provided for a user to visualize different traces of a property. In one example, where a property is implemented using a property signal in the requirements model (e.g., so that a violation of the property is indicated by value 0 in the property signal), a trace for the requirement illustrates the values of the property signal and a number of signals related thereto over one or more clock cycles. Embodiments of the invention include tools to allow the user to find additional traces for the property by applying various constraints to the next trace. In this way, the user can verify how a property has been encoded in the requirements model by visualizing how the property signal and its related signals act under various operating conditions. These conditions can be regarded as visualization constraints that are applied to the trace generation algorithm temporarily for the purpose of obtaining a different trace. By applying constraints to new signals cumulatively, a series of traces can be saved and navigated to allow a user to understand whether a property is modeled properly in the requirements model.

Once a user visualized and debugged the properties (e.g., as high-level requirements embodied in the requirements model), the properties may then be used to verify a circuit design. In this way, appropriate properties can be created and debugged before they are actually used in the verification process with simulation or formal verification. When errors or bugs in the design are found during verification, therefore, a designer can be relatively certain that the error is actually in the circuit design and not merely in the way the properties were encoded.

In contrast to the wait-and-see type of verify-after-the-fact mentality common to verification through simulation, embodiments of the invention incorporate a proactive and controlled prove-as-you-design approach. This approach to verification more closely follows a circuit design's evolution so that the requirements and assumptions for the design and its operating environment are generated as a set of properties and debugged using the invention while the design is still fluid and cannot be relied upon to debug the requirements and assumptions.

DETAILED DESCRIPTION OF THE PREFERRED EMBODIMENTS

Types of properties that may be visualized with embodiments of the invention include Boolean properties, temporal properties, and high-level properties. Boolean properties are typically captured natively as a Boolean expression in an HDL language or a verification language. A temporal property may include a collection (one or multiple) of logical and temporal relationships between and among subordinate Boolean expressions, sequential expressions, and other properties that in aggregate represent a set of behaviors. Temporal sequences of events are typically specified in a verification language such as SVA and PSL. A high-level property may include a collection (one or multiple) of Boolean and temporal properties together with auxiliary logic that is not needed for the design but is needed for verification. High-level properties are typically encoded in a requirements model, which defines some finite state machines and a number of temporal properties represented either by actual signals or by names.

Figure 2:
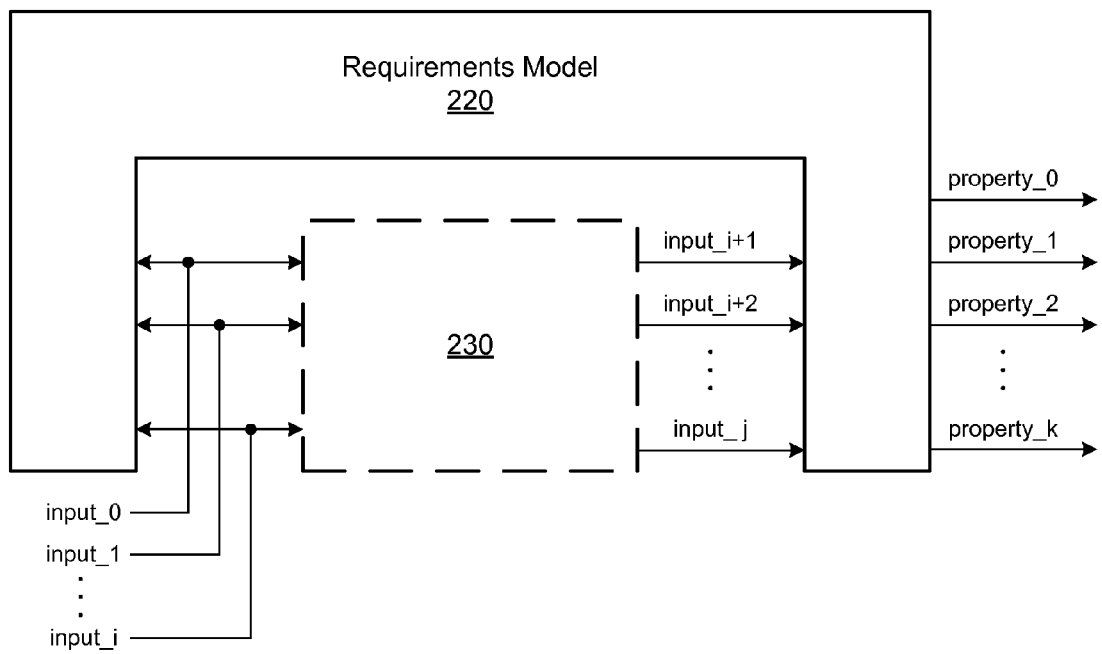
FIG. 2 is a block diagram of a requirements model and test signals used to visualize the model, in accordance with an embodiment of the invention.

Rather than debugging and verifying a set of properties and a circuit design as a single unit, embodiments of the invention allow a designer to debug a set of properties independently of a circuit design. FIG. 2 illustrates a requirements model 220 with two sets of input signals and one set of output signals, in accordance with an embodiment of the invention. The requirements model 220 captures a set of properties, such as Boolean properties, temporal properties, or high-level properties. The requirements model is preferably encoded in a hardware design language (HDL), such as Verilog, VHDL, SystemVerilog, or a verification language, such as PSL or SVA, and in a format usable by formal verification software. The requirements model is configured to receive typically two distinct sets of inputs: one set of inputs that is also received by a corresponding circuit design, input_0 to input_i; and another set of inputs that represent the outputs of the circuit design, input_i+1 to input_j. Because the model 220 is not coupled to a circuit design 230, this latter set of inputs for the requirements model 220 is unconstrained. In other embodiments, the requirements model 220 may also receive as inputs signals that correspond to internal signals of the circuit design.

The requirements model 220 also includes a set of output property signals, property_0 to property_k. Each of these property signals indicates, either directly or indirectly, whether one or more properties encode within the requirements model are satisfied. Typically, a property is defined so that the property signal is at one value (e.g., low or high) under conditions in which a particular requirement is not violated, and it is at the other value when the requirement is violated. These property signals do not have to be explicit HDL signals within the requirement. When a property specification language is used, such as OVL, SVA, or PSL, property names instead of a HDL signal are typically used to refer to a specific property. The current invention does not depend on the specific use of HDL signals as property signals.

Figure 1:
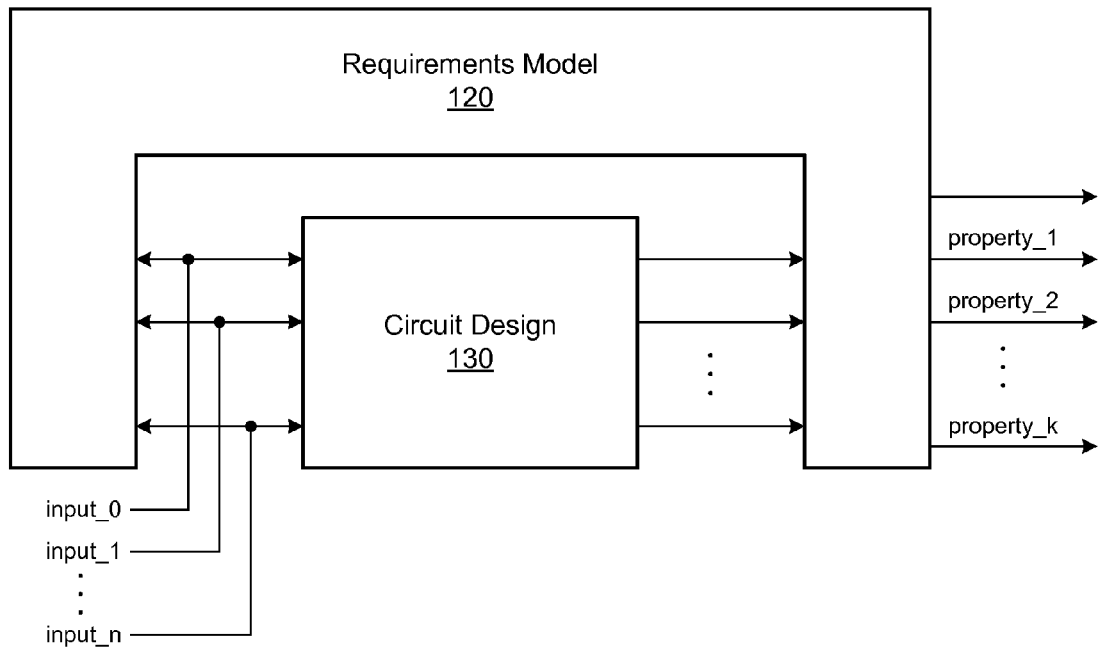
FIG. 1 is a block diagram of a prior art technique for formal verification of a circuit design.

In this way, the requirements model 220 can later be coupled to a circuit design (e.g., in the place of the dotted block 230) for use in simulation and formal verification of that design. It can be appreciated, however, that debugging the requirements model 220 when it is not coupled to a circuit design (e.g., as shown in FIG. 2) involves additional freedom of the model 220 during the debugging process. As compared with the traditional approach (e.g., shown in FIG. 1), the requirements model 220 is not coupled to an attached circuit design and thus includes additional unconstrained signals (e.g., the signals input_i+I to input_j).

Figure 3:
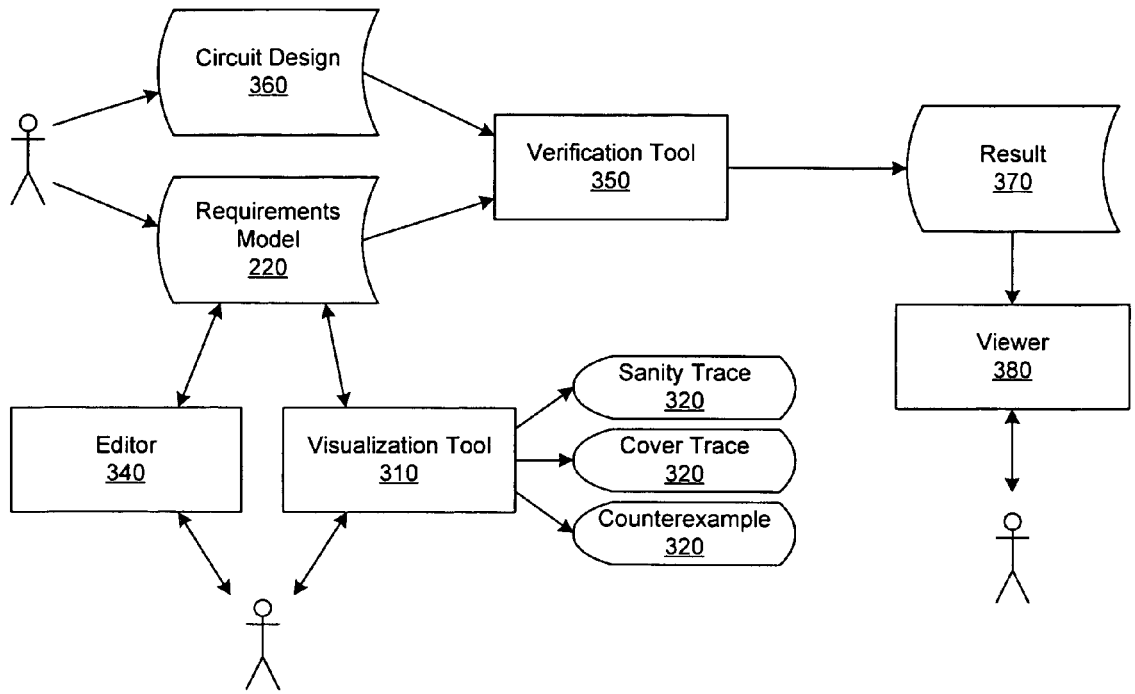
FIG. 3 is a block diagram of a formal verification process, in accordance with an embodiment of the invention.

FIG. 3 illustrates an embodiment of a verification methodology in which a requirements model 220, such as that shown in FIG. 2, is debugged before it is used in the verification of a circuit design. A user, such as a circuit designer, supplies the requirements model 220, which may be directly coded by a user or captured in an automated process.

A designer or verification engineer then uses a visualization tool 310 to access and review the requirements model 220. The visualization tool 310 allows the user to visualize the requirements model 220 independently of a circuit design. Preferably, the tool 310 displays a trace for a selected requirement. For a particular requirement, a trace includes a waveform of the property signal of the requirements model 220 that corresponds to the selected property, as well as other signals in the requirements model 220 that may affect the property signal in question. In one embodiment, the user can also manually add additional signals that are of interest to the user.

One embodiment of the invention generates three kinds of traces: a counterexample trace and two kinds of witness traces. A counterexample trace may be generated to show how the property may be violated. When the property is used as an assertion, a counterexample trace shows how a buggy design may violate the assertion. When the property is used as an assumption on the inputs to the design, the counterexample trace shows a scenario in which the environment is providing an illegal stimulus. The two kinds of witness traces that may be generated are sanity traces and cover traces. A sanity trace may show how the property correctly monitors the activities in a circuit design that satisfies the property. A cover trace may show how a temporal sequence can reach an intermediate state or how the auxiliary logic in a high-level property may reach a certain state.

In one embodiment, the visualization tool 310 allows the user to obtain additional traces that show different scenarios in the requirements model 220 and/or a different number of clock cycles. In this way, a user can use the tool 310 to visualize the encoded requirement (i.e., the property signal that indicates whether the requirement is met) under a variety of operating conditions (visualization constraints).

The user thus determines whether the requirements model 220 correctly encodes a particular requirement by viewing a sufficient number of traces that show how the model 220 behaves under various conditions. If the user is satisfied that the requirements model 220 is correct for a given property, the user may display and save the traces 320 generated for the property for documentation purposes.

Conversely, the user may determine that the requirements model 220 is incorrectly coded for a particular property. The requirements model 220 may be incorrect, for example, if the property signal indicates a violation of the property under conditions that should satisfy the intended requirement (i.e., a false negative), or if the property signal fails to indicate a violation of the property under conditions that should violate the intended requirement (i.e., a false positive). In such a case, the visualization tool 310 may include a context sensitive debugging environment to pinpoint the exact source of the problem in the property description within the requirements model. U.S. patent application Ser. No. 10/401,315, filed Mar. 27, 2003, the contents of which as incorporated in full by reference, specifies examples of a context sensitive debugging environment that could be used. In one embodiment, the counterexample or witness trace 320 illustrates traces obtained with a set of conditions under which the requirements model 220 that results in a false negative or a false positive.

If an error is detected in the requirements model 220, the user may revise the model 220 using an editor 340. The editor 340 may be incorporated into the visualization tool 310 or may be another application, for example whatever application was used to create the original requirements model 220. Due to the visualization of the error condition provided by the visualization tool 310, the user likely has a good understanding of the error and, more importantly, how to revise the model 220 to eliminate the error. Through an iterative process of visualization and revision, a user can thus debug the requirements model 220 for each of the properties.

Once the user is satisfied that the requirements model 220 is correct, the requirements model 220 is provided to a verification tool 350 which may be a simulator or a formal verification tool. A circuit design 360, coded for example in a HDL, is also provided to the verification tool 350. Using the requirements model 220, the verification tool 350 performs verification for the circuit design 360 according to known simulation or formal verification techniques. This process produces a result 370, which may comprise a counterexample if the design 360 fails to meet the requirements encoded in the model 220 or a witness if the design 360 passes. A viewer 380 may also be included to display the counterexample or witness to a user.

Figure 4:
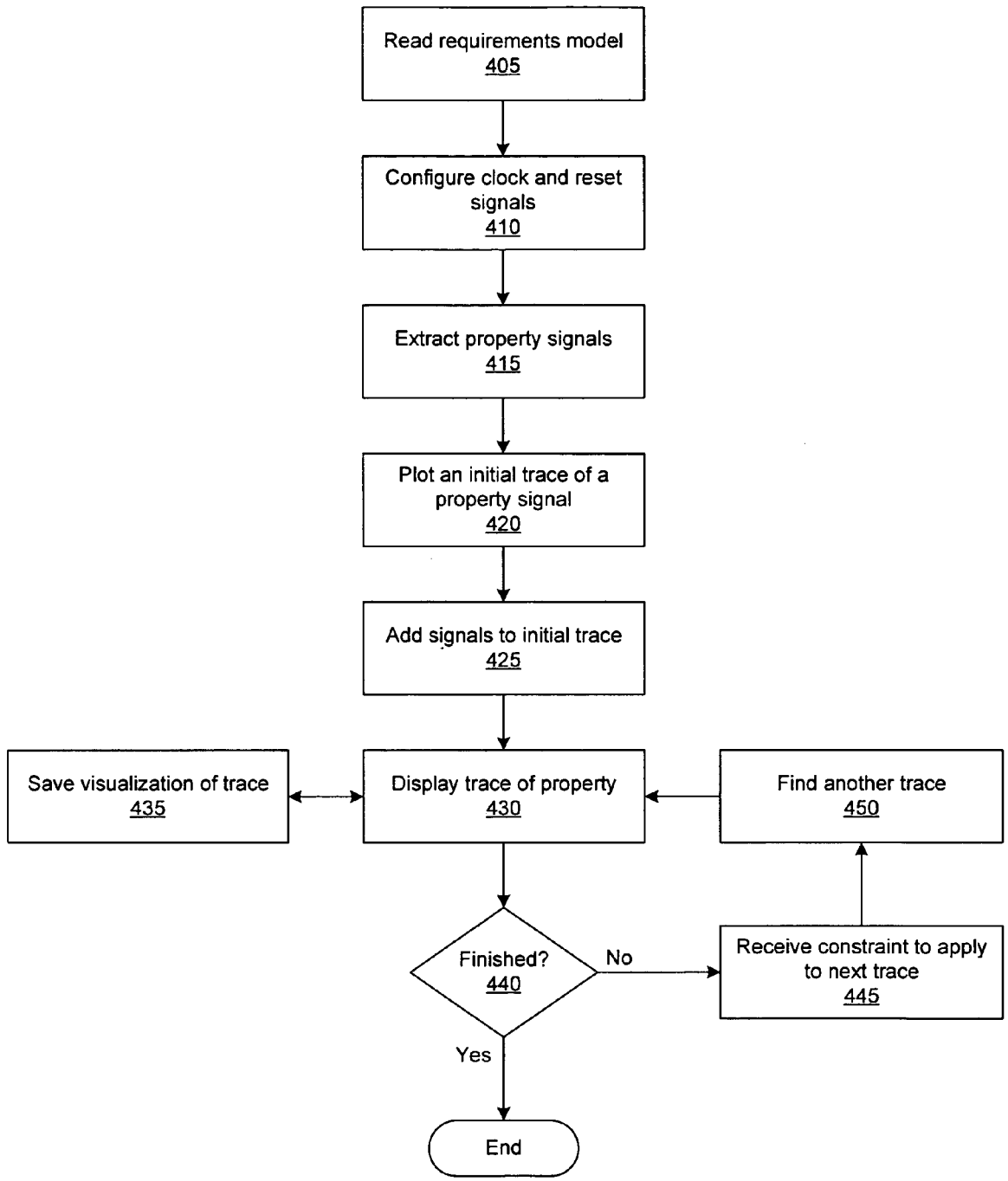
FIG. 4 is a flow chart of a process for visualizing a set of high-level requirements, in accordance with an embodiment of the invention.

As described, the visualization tool 310 allows a user to view various traces of the property signal in the requirements model 220 that indicates the behavior of a particular property. FIG. 4 is a flow diagram that shows the operation of one embodiment of the visualization tool 310. The process illustrated in FIG. 4 could be performed for each of the property signals in the requirements model 220, thereby visualizing and checking how accurately each of the properties are tested by the model 220.

In one embodiment, the visualization tool 310 reads 405 in the requirements model 220 and then configures 410 the clock and reset signals to be used with the model 220. Because the requirements model 220 has a number of signals, only some of which are property signals, the tool 310 extracts 415 those property signals that capture the appropriate properties in the requirements model. In one embodiment, the tool 310 automatically incorporates the property signals, although the tool 310 may rely in part or entirely on user interaction to identify the property signals. Various methods of identifying the property signals can be used. For example, the tool 310 may use any combination of several techniques for identifying the property signals in the model 220, including: reading comments in the HDL code of the requirements model 220, using naming conventions for the property signals, and detecting the "assume," "assert," and "cover keywords in a verification language in the requirements model 220. These techniques are presented for illustration purposes only, as a number of techniques could be used to identify the property signals in the requirements model 220.

Once the property signals in the model 220 are identified, a selected property signal can be visualized to determine whether it correctly tests a particular high-level requirement. In one embodiment, the property signal is visualized by plotting 420 an initial trace of the property signal and adding 425 other signals of the model 220 in the trace. Depending on the application, various signals can be added to the trace to provide a meaningful visualization of the operation for a specific property within the requirements model 220. Such signals include the property signal itself, the immediate fan-in of the property signal, and the transitive fan-in of the property signal. The immediate fan-in of a property signal includes the signals in the requirements model 220 that directly affect the value of the property signal, while the transitive fan-in includes signals that affect the property signal through one or more indirect links. The trace is then displayed 430 to the user.

Figure 5:
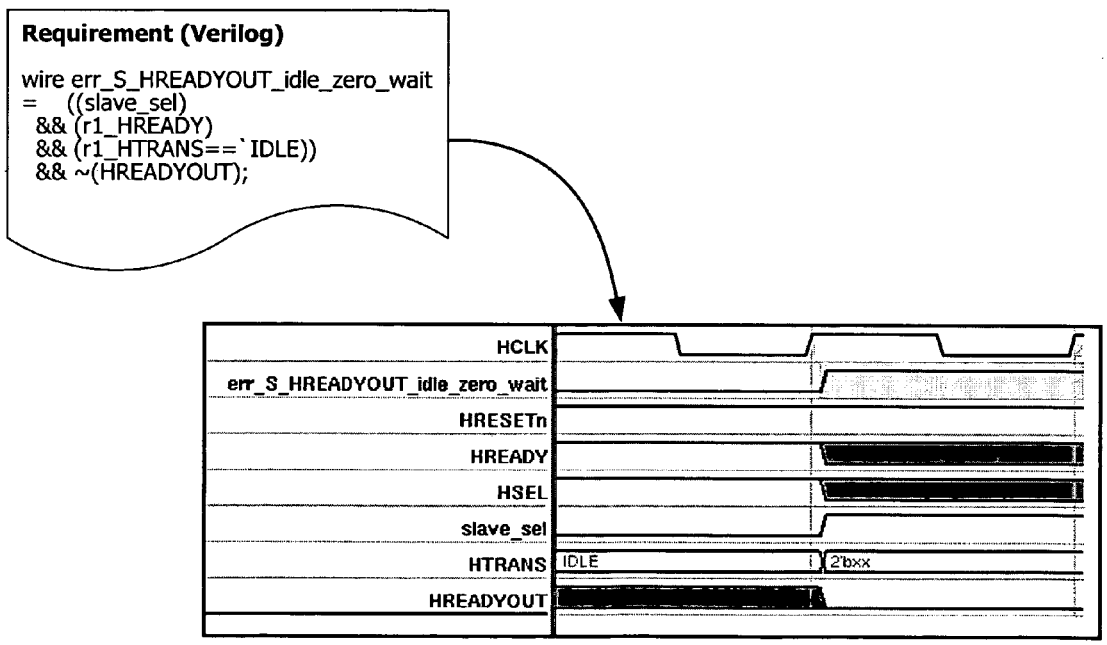
FIG. 5 illustrates a trace and a corresponding portion of the requirements model for an example property, in accordance with an embodiment of the invention.

FIG. 5 illustrates a trace for an example property signal as well as a portion of the requirements model that defines the property signal. In this example, the requirements model is written in Verilog, and the property signal is defined according to:

wire err_S_HREADYOUT_idle zero_wait =
((slave_sel) && (r1_HREADY) &&
(r1_HTRANS=='IDLE)) && ~(HREADYOUT);

The property signal, named err_S_HREADYOUT_idle_zero_wait, is defined as a logical function of four other signals in the requirements model: slave_sel, HREADY, HTRANS, and HREADYOUT. These four signals are part of the fan-in of the property signal. The high-level requirement that is modeled by the property signal is satisfied as long as the property signal remains at logic low. The visualization of the requirement shown on the display is a trace that includes the property signal and its fan-in for two clock cycles.

It can be appreciated that the trace shown in FIG. 5 illustrates a scenario in which a circuit design has violated the assertion during the second clock period under a given set of conditions. Traces that show interesting behavior with respect to the property, however, may not be (and typically are not) generated and visualized on the first attempt. Rather, once the user has visualized a trace of the property in question, the user will likely want to find additional traces that show specific events. Accordingly, if 440 the user is not finished looking at traces of the property, the tool 310 allows a user to find 450 another trace for the property. As described in more detail below, the tool 310 preferably allows the user to add 445 visualization constraints on the next trace to be generated. In that way, the user may apply intuition about the intended behavior of the property in the requirements model in order to test its accuracy. The user may continue to add 445 constraints while finding 450 more traces. In one embodiment, subsequent traces that are found by the tool 310 are constrained by all constraints that were specified by the user for all previous traces.

When a particular trace of a property is being displayed 430, the user may save 435 a visualization of the trace. This trace may show a violation of the property (i.e., a counterexample), a satisfaction of the property (i.e., a sanity trace), or a satisfaction of the property after a certain time (e.g., a cover trace). Using these kinds of traces, a user may then determine whether the property is exhibiting the expected or desired behavior under the set of conditions specified. Through adding 445 constraints to traces that are found 450, the user may specify particular sets of conditions under which to observe the behavior of the property. For example, a sanity trace that shows an illegal behavior, or a cover trace that shows the auxiliary logic has entered a specific state unexpectedly. These traces are useful in part because they may give the user an insight into how to fix the error in the requirements model.

Given a complex property expressed in a verification language, the tool 310 should be able to extract appropriate extra conditions to complement the visualization of the full property. For example, a property of the form "A implies B" can be visualized directly using violation traces and sanity traces. But a cover trace on "A" is also helpful in debugging the full property "A implies B."

Figure 7:
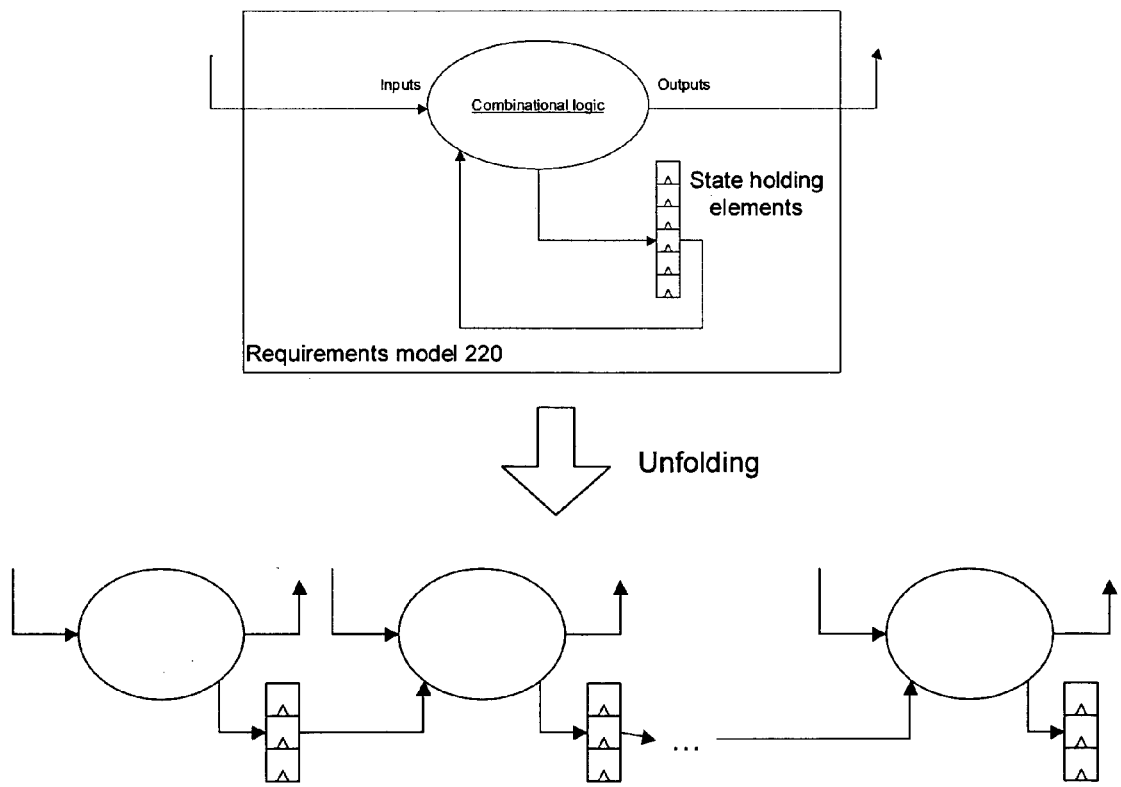
FIG. 7 is a diagram of one embodiment of generating a trace according to a Satisfiability (SAT) algorithm with unfolding of the requirements model.

In one embodiment; a violation, sanity, or cover trace is generated with an algorithm that uses the Satisfiability (SAT) algorithm. Described for example in Edmund Clarke, Armin Biere, Richard Raimi, and Yunshan Zhu, "Bounded Model Checking Using Satisfiability Solving," *Formal Methods in System Design,* 2001, bounded model checking using SAT is a known method for "unfolding" the logic specified in a model, where each unfolding is an instance of the model. Because the instances are cascaded, as shown in FIG. 7, the state variables for each instance show the values for a given time. When plotted, these state variables are a trace over a number of clock cycles equal to the number of unfoldings of the model. In this way, the SAT algorithm can be applied to find a value assignment to the inputs at each cycle to cause the property to hold at all cycles except the last cycle of the unfolding and to fail at the last cycle of the unfolding. This procedure is the same as using SAT to generate a counterexample in formal verification, and it can be similarly applied to generate a counterexample from the property without the design. To generate a sanity trace or a cover trace, the basic SAT algorithm is modified to cause the property to hold at all cycles for a sanity trace, and to hold at the last cycle for a cover trace (while leaving the property to either hold or fail at other cycles). Other embodiments of the invention may use Binary Decision Diagram (BDD) or other known techniques. The use of BDD in formal verification is described in Ken McMillan, *Symbolic Model Checking,* Kluwer Academic Publisher, 1993.

In one embodiment of the invention, the tool 310 uses the SAT algorithm to generate a violation trace (or counterexample), where the property is violated for example in the last clock cycle of the trace. This can be done using the basic SAT algorithm by analyzing only the requirements model without the design. Constraints are then added to find a satisfiability solution in which the property is constrained to 0 in the last step in the unfolded circuit, and to 1 in all other steps in the unfolded circuit. Starting with an unfolding of length 1, the algorithm iteratively increases the unfolding length until a satisfiability solution is found. The resulting trace represents the shortest number of time steps in which a property can be violated.

In another embodiment of the invention, the tool 310 uses the SAT algorithm to generate a sanity trace, a type of witness, where the property is satisfied for all clock cycles of the trace. This can be done by modifying the basic SAT algorithm so that the property is constrained to 1 in all steps in the unfolded circuit. (When no visualization constraint is used, this typically generates a one-cycle trace.)

In another embodiment of the invention, the tool 310 uses the SAT algorithm to generate a cover trace, a type of witness, where the property is satisfied during at least the last clock cycle of the trace. This can be done by modifying the basic SAT algorithm so that the property is constrained to 1 in the last step of the unfolded circuit (the property is left unconstrained in other steps of the unfolded circuit.

In formal verification, the "find another trace" feature enables a user to direct the tool to find another trace with exactly the same length and yet avoid a specific combination of values in the specific cycle. This concept can be used with simple restriction to find an alternate violation trace in formal verification. But while the goal in formal verification is to fix the design so that no violation trace is possible, a purpose of an embodiment of the invention is not to eliminate all violation traces. Furthermore for visualizing properties, where the design is not present, the number of possible violation traces increases drastically. The simple restriction is thus not efficient in narrowing the number of possibilities to give interesting traces to the user. Embodiments of the invention enable efficient extraction of interesting traces from the large number of possible traces. Moreover, unlike how one might find additional traces during a formal verification process, in visualization, additional traces are typically longer if no trace with the same number of clock cycles exists that satisfies the additional visualization constraint.

As explained above, embodiments of the invention allow a user to apply a visualization constraint on the next trace to be found by the tool. In this way, the user's intuitive understanding about the requirements model may be used in the visualization process, thereby increasing the likelihood of finding a more interesting trace in successive iterations. In various embodiments, the tool 310 provides for one or more of the following constraints: restrict, force, force until, force after, at least once, at least N times, min-length, distinct states, and at least once for a condition followed by at least once for another condition.

Figure 8:
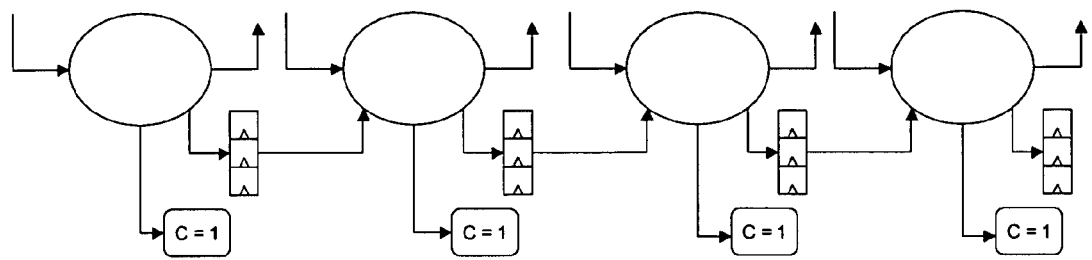
FIG. 8 is a diagram showing the application of a "restrict" constraint to a new trace, in accordance with one embodiment of the invention.

Using the "restrict" constraint, the user can prevent specific signals in the next trace from having a particular value. Accordingly, to use this constraint, the user specifies a condition which future traces cannot have. In this context, a condition describes the values of one or more signals. In one embodiment, a user selects at least one signal in a currently viewed trace. The tool 310 then generates a negation of the condition that exists in the current trace. For example, if the user clicks on a signal s1 in a clock cycle in which the signal has a value of v1, the negation of that condition is: $\sim(s1{=}{=}v1)$. In this example, the signal s1 in the next trace would never have a value of v1. The tool 310 may also allow the user to manually modify this restriction. The restrict constraint ensures that any subsequent traces will not allow the specified condition to exist during any clock cycle of the trace, and different value assignments to the inputs are generated, leading to a different trace. In one embodiment, the restrict constraint is applied using the SAT algorithm by applying appropriate conditions to the stages of an unfolded requirements model, as shown in FIG. 8. In the example, the specified condition is true (denoted by C=1) in each stage of the unfolded model, corresponding to each clock cycle of the trace.

Figure 9:
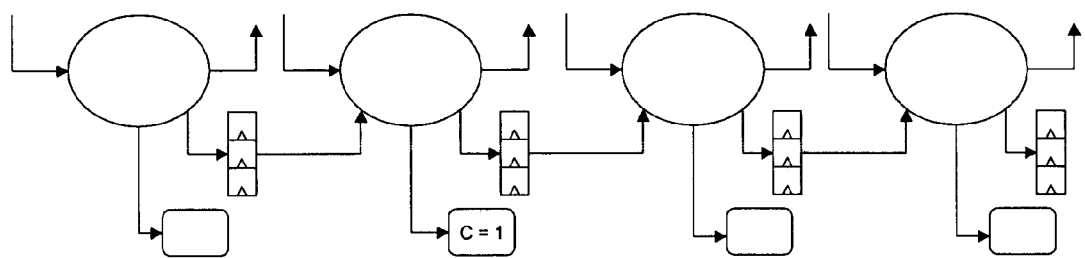
FIG. 9 is a diagram showing the application of a "force" constraint to a new trace, in accordance with one embodiment of the invention.

As a converse to the "restrict" constraint, the "force" constraint forces one or more signals in a trace to have a specified value at a specific time. Accordingly, the user specifies a time and the condition that must occur at the specified time. As with the "restrict" constrain, the user may specify the signals and values by selecting one or more signals in a currently viewed trace. The tool 310 may then generate the negation of that condition, where the next trace is constrained so that the specified condition is false during the specified $n^{th}$ clock cycle. In one embodiment, the force constraint is applied using the SAT algorithm by applying appropriate conditions to the stages of an unfolded requirements model, as shown in FIG. 9.

Figure 10:
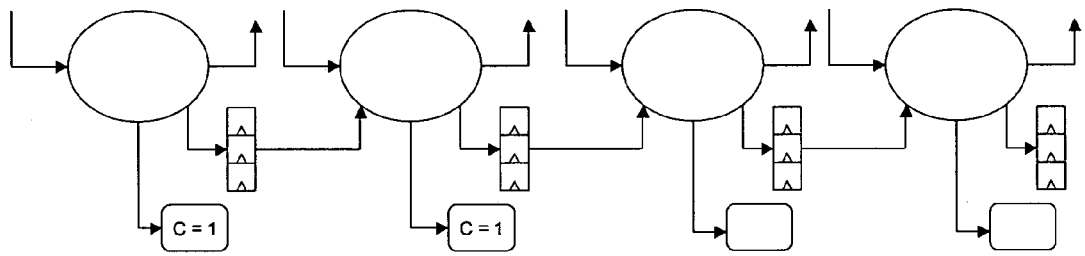
FIG. 10 is a diagram showing the application of a "force until" constraint to a new trace, in accordance with one embodiment of the invention.
Figure 11:
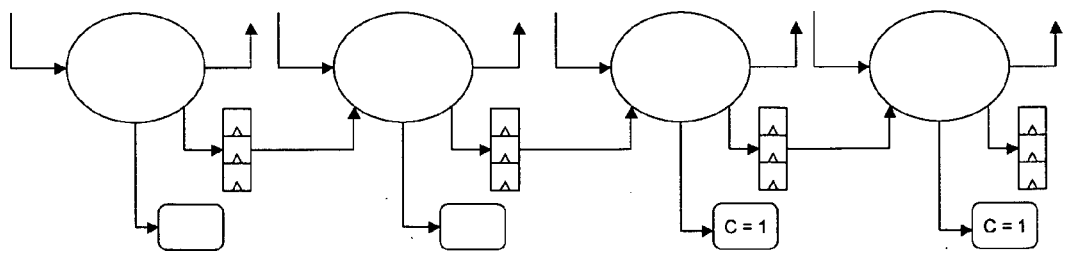
FIG. 11 is a diagram showing the application of a "force after" constraint to a new trace, in accordance with one embodiment of the invention.

Similar to the "force" constraint, the "force until" constraint forces one or more signals in a trace to have a specified value (i.e., a condition) until a specific time. Accordingly, the user may specify a time and a condition as described above, and the condition occurs in the generated trace until the specified time. Similarly, the "force after" constraint forces one or more signals in a trace to have a specified value starting from a specific time until the end of the trace. Accordingly, the user may specify a time and a condition, and the condition occurs in the generated trace from the specified time and is maintained until the end of the trace. In one embodiment, the "force until" constraint is applied using the SAT algorithm by applying appropriate conditions to the stages of an unfolded requirements model, as shown in FIG. 10, and the "force after" constraint is applied using the SAT algorithm by applying appropriate conditions to the stages of an unfolded requirements model, as shown in FIG. 11.

Figure 12:
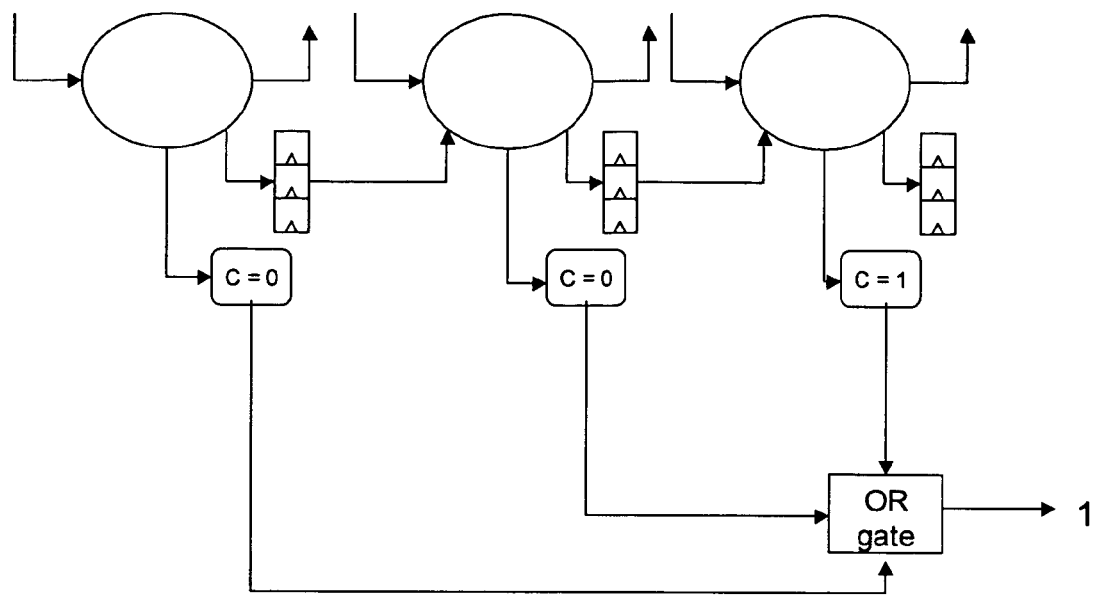
FIG. 12 is a diagram showing the application of an "at least once" constraint to a new trace, in accordance with one embodiment of the invention.
Figure 13:
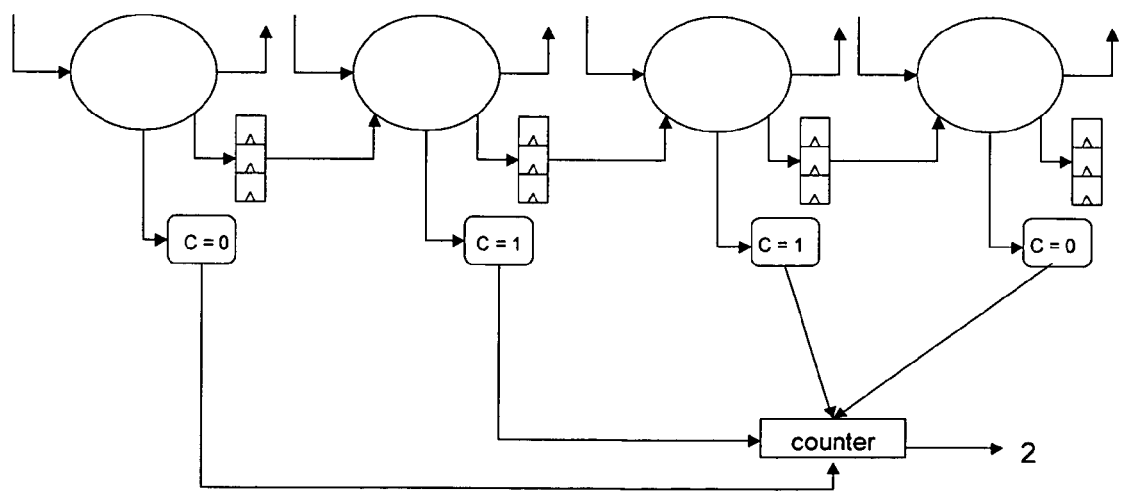
FIG. 13 is a diagram showing the application of an "at least N times" constraint to a new trace, in accordance with one embodiment of the invention.

The "at least once" constraint allows a user to specify a condition that must happen at least once in the trace. Accordingly, the user specifies a condition that must occur in the next trace generated. Again, the condition describes the values of one or more signals, which for this constraint may occur during any clock cycle. The "at least N times" constraint is a generalized version of the once constraint, allowing a user to specify a condition that must happen at least N times in a trace and allowing the user to specify that number N. Preferably, N is an integer greater than or equal to zero, and typically N is greater than 1. To modify the basic SAT algorithm for these constraints, the requirements model is unfolded once, and the constraints are then attached to force the value assignments to happen at least once for the trace, at least N times, or until after a specified time, as appropriate for the applied constraint. In one embodiment, if no trace can be found, the constraints are removed, the unfolding is repeated, and the constraints are reapplied and possibly modified to take into account the new unfolding. In one embodiment, the "at least once" constraint is applied using the SAT algorithm by applying appropriate conditions to the stages of an unfolded requirements model, as shown in FIG. 12, and the at least N times constraint is applied using the SAT algorithm by applying appropriate conditions to the stages of an unfolded requirements model, as shown in FIG. 13.

The min-length constraint allows a user to specify a minimum length, such as n clock cycles, so that the error condition does not occur before the $n^{th}$ clock cycle and occurs, if at all, thereafter. Accordingly, the user specifies this time value, n. This constraint may be used to avoid trivial violation traces, helping the user obtain a more instructive trace for fixing any errors in the requirements model. To handle the min-length constraint, the unfolding of the logic in the requirements model is done at least n times.

Figure 14:
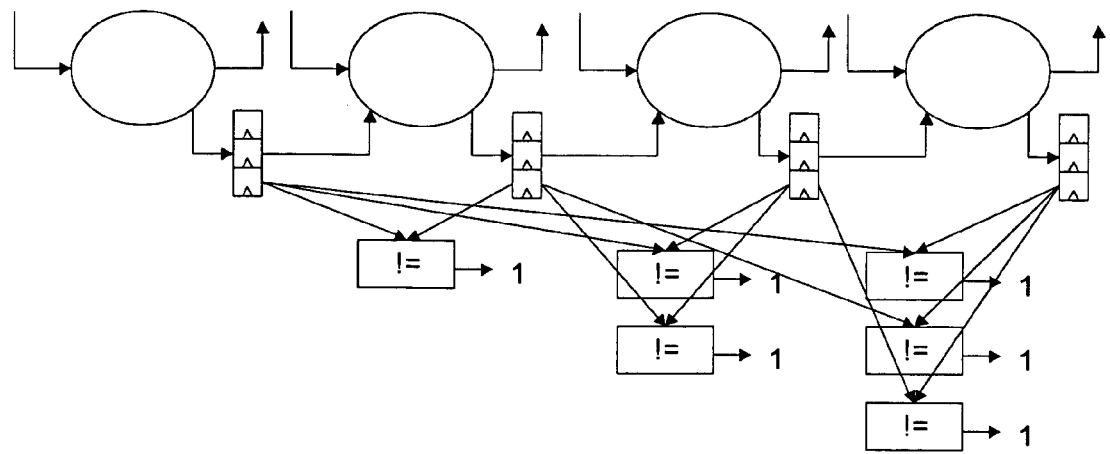
FIG. 14 is a diagram showing the application of a "distinct states" constraint to a new trace, in accordance with one embodiment of the invention.

The "distinct states" constraint allows a user to mandate that the set of values in the trace not be the same for any pair of clock cycles in the trace. In one embodiment, the distinct states constraint is applied using the SAT algorithm by applying appropriate conditions to the stages of an unfolded requirements model, as shown in FIG. 14.

Figure 15:
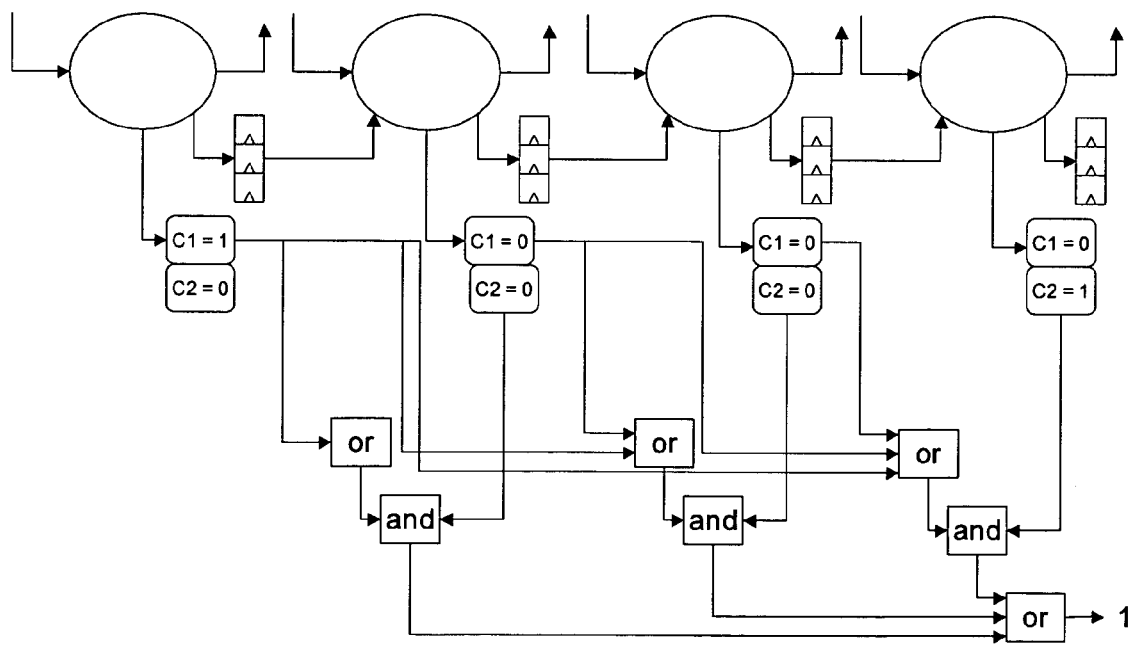
FIG. 15 is a diagram showing the application of an at least once for a condition followed by at least once for another condition constraint to a new trace, in accordance with one embodiment of the invention.

The constraint "at least once for a condition followed by at least once for another condition" allows the user to specify a scenario in which a first condition must occur at least once, after which a second condition must occur at least once. Accordingly, the user specifies these first and second conditions, and the tool 310 then generates a trace that complies with this constraint. This constraint shows how the current set of constraints can be composed to form more complex constraints as needed. In one embodiment, this constraint is applied using the SAT algorithm by applying appropriate conditions to the stages of an unfolded requirements model, as shown in FIG. 15.

Although a number of useful constraints are described, the constraints that can be applied in the generation of traces are not limited by those described above. For example, any sequence written in PSL, a property specification language, can be converted into a constraint. Therefore, persons skilled in the art may apply any one or combination of constraints that can be useful to find additional meaningful traces.

Figure 6:
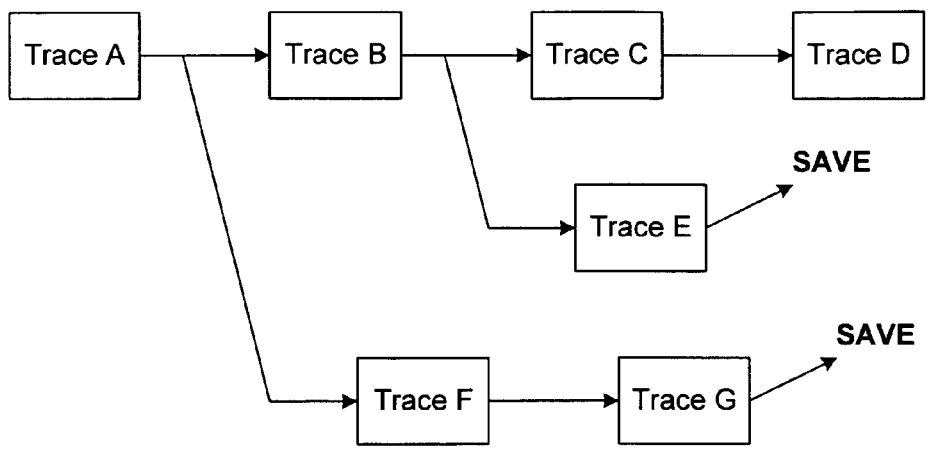
FIG. 6 is a diagram of the relationship of a number of traces, showing the branching of the cumulative structure of constraints for an example set of traces, in accordance with an embodiment of the invention.
Figure 16:
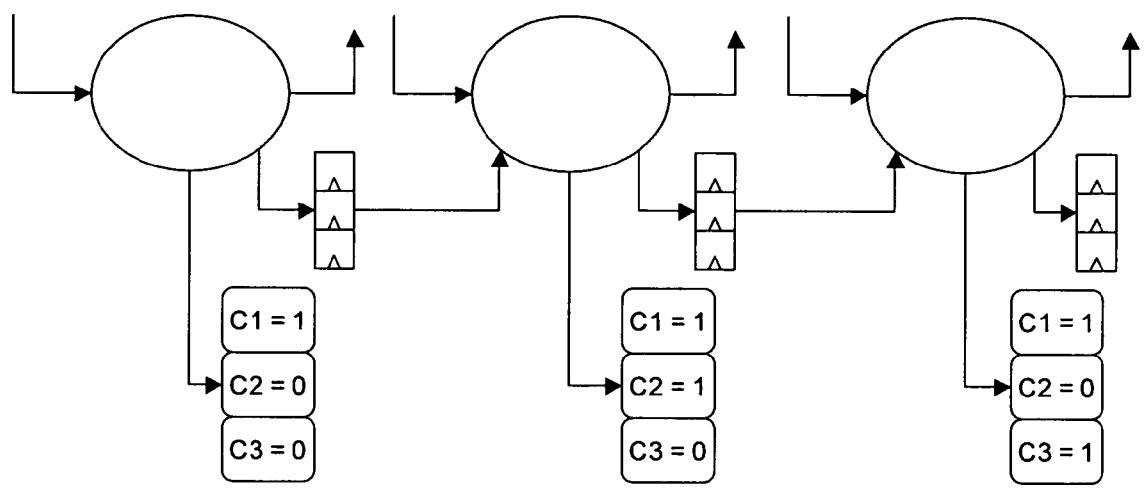
FIG. 16 is a diagram showing the application of a plurality of constraints to a new trace cumulatively, in accordance with one embodiment of the invention.

In one embodiment of the invention, the constraints applied to the traces generated by the tool 310 are cumulative. In this way, each new trace that is generated conforms not only to the most recent constraint applied, but also to all of the previously applied constraints. In addition, the cumulative nature of the applied constraints may branch, as shown in FIG. 6. This allows the user to apply constraints cumulatively, save selected traces, back out of some of the constraints, and then apply different constraints as desired. In this way, the traces generated by the tool 310 can follow a branch pattern, allowing the user to try various avenues in an attempt to find appropriate traces. In one embodiment, the tool 310 provides navigation commands (e.g., forward and backward buttons), which allow the user to go back and forward in the branch structure. In one embodiment, cumulative constraints are applied using the SAT algorithm by applying appropriate sets of conditions to the stages of an unfolded requirements model, as shown in FIG. 16.

Any of the steps, operations, or processes described herein can be performed or implemented with one or more software modules or hardware modules, alone or in combination with other devices. It should further be understood that any portions of the system described in terms of hardware elements may be implemented with software, and that software elements may be implemented with hardware, such as hard-coded into a dedicated circuit. In one embodiment, a software module is implemented with a computer program product comprising a computer-readable medium containing computer program code, which can be executed by a computer processor for performing any or all of the steps, operations, or processes described herein.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above teachings. It is therefore intended that the scope of the invention be limited not by this detailed description, but rather by the claims appended hereto.

What is claimed is:

1. A computer-implemented method for evaluating a set of properties to be used in verification of a circuit design, the method comprising:

receiving a requirements model for the circuit design, the requirements model defining the properties as a function of a set of input signals and a set of output signals of the circuit design;

generating a plurality of traces for a selected property of the set of properties, each trace including waveforms for each of at least some of the input and/or output signals that drive the selected property for a number of clock cycles, wherein the set of output signals are unconstrained by the set of input signals according to the circuit design; and displaying one or more of the traces on a user interface.

2. The method of claim 1, further comprising:

displaying a trace showing a waveform in which the selected property is violated.

3. The method of claim 1, further comprising:

displaying a trace showing a waveform in which the selected property is satisfied.

4. The method of claim 1, further comprising:

displaying a trace showing a waveform in which the selected property is satisfied at the end of the trace.

5. The method of claim 1, wherein the requirements model is written in a hardware design language (HDL) or a verification language.

6. The method of claim 1, wherein generating one of the plurality of traces comprises:
receiving a constraint from a user; and
generating a new trace that conforms to the user-specified constraint.

7. The method of claim 6, wherein generating the new trace comprises applying the constraint to a previously generated trace to obtain the new trace.

8. The method of claim 6, wherein the constraint is obtained by receiving a specific condition in a viewed trace, where the constraint causes the new trace to avoid that condition.

9. The method of claim 6, wherein generating the new trace further comprises applying a set of constraints that were specified for a set of previously generated traces so that the new trace conforms to all of the constraints.

10. The method of claim 6, wherein the constraint mandates that a condition occur throughout the trace, the condition describing a set of values for one or more signals in the trace.

11. The method of claim 6, wherein the constraint forces the trace to have a condition at a specified time, the condition describing a set of values for one or more signals in the trace.

12. The method of claim 6, wherein the constraint forces the trace to have a condition until a specified time, the condition describing a set of values for one or more signals in the trace.

13. The method of claim 6, wherein the constraint forces the trace to have a condition after a specified time, the condition describing a set of values for one or more signals in the trace.

14. The method of claim 6, wherein the constraint mandates that a condition happen at least once in the trace, the condition describing a set of values for one or more signals in the trace.

15. The method of claim 6, wherein the constraint mandates that a condition happen at least N times in the trace, where N is a user-specified number greater than or equal to zero, the condition describing a set of values for one or more signals in the trace.

16. The method of claim 6, wherein the constraint causes the trace to have a different state in all cycles of the trace.

17. The method of claim 6, wherein the constraint mandates that the trace have a minimum length.

18. The method of claim 6, wherein the constraint mandates that a first condition happen at least once in the trace and that a second condition happen at least once after the first condition, the first and second conditions each describing a set of values for one or more signals in the trace.

19. The method of claim 1, further comprising:
saving at least one of the generated traces for subsequent viewing.

20. The method of claim 1, wherein the property is configured for debugging the circuit design.

21. The method of claim 20, further comprising:
a step for finding additional traces of the property to illustrate how the property tests a circuit design; and
a step for applying a user-specified constraint to the step for finding additional traces.

22. The method of claim 21, wherein the step for finding additional traces cumulatively applies constraints from previously found traces.

23. A methodology for debugging a set of properties before using the properties to verify a circuit design, the methodology comprising:
generating a requirements model for use in verification of a circuit design according to the properties, the requirements model defining the properties as a function of a set of input signals and a set of output signals of the circuit design;
for each of at least a subset of the properties:
generating a plurality of traces for the property, each trace including waveforms for each of at least some of the input and/or output signals that drive the property for a number of clock cycles, wherein the set of output signals are unconstrained by the set of input signals according to the circuit design, and
displaying one or more of the traces for the property; and
for each of at least a subset of the properties, responsive to observing an unintended behavior of the property in a trace, editing the property to correct for the unintended behavior.

24. The methodology of claim 23, further comprising:
performing a verification of a circuit design using the edited set of properties.

25. The methodology of claim 23, wherein at least one of the visualized traces is generated according to a constraint specified by a user.

26. The methodology of claim 25, wherein the constraint restricts the trace to satisfy a condition during all clock cycles, the condition describing a set of values for one or more signals in the trace.

27. The methodology of claim 25, wherein the constraint forces the trace to have a condition at a specified time, the condition describing a set of values for one or more signals in the trace.

28. The methodology of claim 25, wherein the constraint causes the trace to have a condition until a specified time, the condition describing a set of values for one or more signals in the trace.

29. The methodology of claim 25, wherein the constraint mandates that a condition happen at least once in the trace, the condition describing a set of values for one or more signals in the trace.

30. The methodology of claim 25, wherein the constraint mandates that a condition occur at least N times in the trace, where N is a user-specified number greater than zero, the condition describing a set of values for one or more signals in the trace.

31. The methodology of claim 25, wherein the constraint mandates that the trace be longer than a specified length.

32. The methodology of claim 25, wherein the constraint mandates that a condition occur in the trace after a specified time, the condition describing a set of values for one or more signals in the trace.

33. The methodology of claim 25, wherein the constraint mandates that the trace have different states at all clock cycles.

34. The methodology of claim 25, wherein at least one of the visualized traces is generated according to a set of constraints that were specified for a set of previously generated traces so that the new trace conforms to all of the constraints.

35. The methodology of claim 25, wherein the constraint is specified by a user's selecting a specific condition in a viewed trace, where the constraint causes the new trace to avoid that condition.

36. A computer program product for evaluating a set of properties to be used in verification of a circuit design, the computer program product comprising a computer-readable medium containing computer program code for performing the method comprising:

receiving a requirements model for the circuit design, the requirements model defining the properties as a function of a set of input signals and a set of output signals of the circuit design;

generating a plurality of traces for a selected property of the set of properties, each trace including waveforms for each of at least some of the input and/or output signals that drive the selected property for a number of clock cycles, wherein the set of output signals are unconstrained by the set of input signals according to the circuit design; and displaying one or more of the traces on a user interface.

37. The computer program product of claim 36, the method further comprising:

displaying a trace showing a waveform in which the selected property is violated.

38. The computer program product of claim 36, the method further comprising:

displaying a trace showing a waveform in which the selected property is satisfied.

39. The computer program product of claim 36, the method further comprising:

displaying a trace showing a waveform in which the selected property is satisfied at the end of the trace.

40. The computer program product of claim 36, wherein the requirements model is written in a hardware design language (HDL) or a verification language.

41. The computer program product of claim 36, wherein generating one of the plurality of traces comprises:

receiving a constraint from a user; and generating a new trace that conforms to the user-specified constraint.

42. The computer program product of claim 41, wherein generating the new trace comprises applying the constraint to a previously generated trace to obtain the new trace.

43. The computer program product of claim 41, wherein the constraint is obtained by receiving a specific condition in a viewed trace, where the constraint causes the new trace to avoid that condition.

44. The computer program product of claim 41, wherein generating the new trace further comprises applying a set of constraints that were specified for a set of previously generated traces so that the new trace conforms to all of the constraints.

45. The computer program product of claim 41, wherein the constraint mandates that a condition occur throughout the trace, the condition describing a set of values for one or more signals in the trace.

46. The computer program product of claim 41, wherein the constraint forces the trace to have a condition at a specified time, the condition describing a set of values for one or more signals in the trace.

47. The computer program product of claim 41, wherein the constraint forces the trace to have a condition until a specified time, the condition describing a set of values for one or more signals in the trace.

48. The computer program product of claim 41, wherein the constraint forces the trace to have a condition after a specified time, the condition describing a set of values for one or more signals in the trace.

49. The computer program product of claim 41, wherein the constraint mandates that a condition happen at least once in the trace, the condition describing a set of values for one or more signals in the trace.

50. The computer program product of claim 41, wherein the constraint mandates that a condition happen at least N times in the trace, where N is a user-specified number greater than or equal to zero, the condition describing a set of values for one or more signals in the trace.

51. The computer program product of claim 41, wherein the constraint causes the trace to have a different state in all cycles of the trace.

52. The computer program product of claim 41, wherein the constraint mandates that the trace have a minimum length.

53. The computer program product of claim 41, wherein the constraint mandates that a first condition happen at least once in the trace and that a second condition happen at least once after the first condition, the first and second conditions each describing a set of values for one or more signals in the trace.

54. The computer program product of claim 36, the method further comprising:

saving at least one of the generated traces for subsequent viewing.

55. A product comprising a computer-readable medium containing code that implements a set of properties for use in verification of a circuit design, the properties verified according to the method of any one of claims 1, 20, and 23.

* * * * *